United States Patent [19]
Yajima

[11] Patent Number: 5,923,534
[45] Date of Patent: Jul. 13, 1999

[54] PC CARD

[75] Inventor: Hideo Yajima, Kanagawa, Japan

[73] Assignee: Mitsumi Electric, Co., Ltd., Tokyo, Japan

[21] Appl. No.: 08/975,706

[22] Filed: Nov. 21, 1997

[30] Foreign Application Priority Data

Nov. 22, 1996 [JP] Japan ..................................... 8-327662

[51] Int. Cl.⁶ .................................................. H05K 1/18
[52] U.S. Cl. ........................... 361/737; 361/684; 361/695; 361/791; 439/76.1; 235/492
[58] Field of Search ..................................... 361/686, 737, 361/749, 684, 695, 685, 732, 791; 257/679, 712–723; 455/269; 439/76.1, 353, 638; 235/492, 487

[56] References Cited

U.S. PATENT DOCUMENTS 5,513,074  4/1996  Ainsbury et al. ....................... 361/737
5,537,293  7/1996  Kobayashi et al. ..................... 361/737

*Primary Examiner*—Leo P. Picard
*Assistant Examiner*—Michael Datskovsky
*Attorney, Agent, or Firm*—Whitham, Curtis, Whitham

[57] ABSTRACT

A PCMCIA (Personal Computer Memory Card International Association) expansion PC (Personal Computer) card arranged to be inserted into a PC card slot formed in a portable personal computer as, for example, a radio having an FM teletext broadcast receiving function is disclosed. The PC card is composed of a plate-like card portion arranged to be inserted into the PC card slot and a cover box portion having a thickness larger than that of the card portion. The card portion and the cover box portion are formed individually from each other and separably connected to each other. The card portion has a top cover and a bottom cover having extension portions arranged to be inserted into an insertion opening of the cover box portion, respectively. An internal connector is mounted on a circuit board included in the cover portion to connect with an included connector mounted on a circuit board which is accommodated in the cover box portion.

7 Claims, 3 Drawing Sheets

PC CARD

BACKGROUND OF THE INVENTION

1. Technical Field of the Invention

The present invention relates to a PC (Personal Computer) card having a plate-like card portion arranged to be inserted into a PC card slot and a cover box portion having a thickness larger than that of the card portion, and more particularly to a PCMCIA (Personal Computer Memory Card International Association) expansion PC card arranged to be inserted into a PC card slot provided for a portable personal computer or the like as, for example, a radio having an FM teletext broadcast receiving function.

2. Description of Related Art

A PCMCIA expansion PC card of the foregoing type having a structure as shown in FIGS. 3 and 4 has been known. A PC card 2 shown in the drawings above is arranged to be inserted into a PC card slot formed in a portable personal computer as, for example, a radio having an FM teletext broadcast receiving function and composed of a plate-like card portion 60 arranged to be inserted into the PC card slot and a cover box portion 70 having a thickness larger than that of the card portion 60.

The card portion 60 has a base portion 74 composed of two rectangular columns 74A and 74B horizontally extending from a resin cover 71 of the cover box portion 70, a top cover 62 joined above the base portion 74 and made of stainless steel (SUS), an external connector 64 arranged to be connected to a connector of the PC card slot, a circuit board 65 on which the external connector 64 is mounted and other important electronic elements (not shown) are mounted and a bottom cover 68 joined below the base portion 74 and made of stainless steel (SUS).

On the other hand, the cover box portion 70 accommodates electronic elements (not shown) having a broadcast receiving function. On the outer surface of the cover box portion 70, for example, a volume adjustment knob, an antenna terminal and a headphone terminal (each of which is not shown) are disposed.

The card portion 60 of the PC card 2 having the above-mentioned structure is assembled in such a manner that the top cover portion 62, the circuit board 65 and the bottom cover 68 are stacked on the upper and lower surfaces of the base portion 74 integrated with the resin cover 71 of the cover box portion 70. Thus, the card portion 60 and the cover box portion 70 are integrated and inseparable from each other, that is, separation cannot be performed.

Therefore, whenever the design of the resin cover 71 is changed, molds for the corresponding elements must be again manufactured. As a result, the conventional structure is disadvantageous from a viewpoint of economy because the initial cost is enlarged excessively. What is worse, the dimensions and shape of the cover box portion are limited, thus raising a problem in that the design freedom is unsatisfactory and assembling cannot easily be performed.

SUMMARY OF THE INVENTION

In view of the foregoing, an object of the present invention is to provide a PC card, the initial cost of which can be reduced even if the design of the cover portion is changed because only the smallest number of molds are required to be again manufactured, which has a cover box portion exhibiting satisfactory design freedom and which can easily be assembled.

To achieve the above-mentioned object, a PC card of the present invention basically comprises a plate-like card portion arranged to be inserted into a PC-card slot and a cover box portion having a thickness larger than that of the card portion, wherein the card portion and the cover box portion are formed individually from each other and separably connected to each other.

It is further preferable that the card portion has a top cover having an extension portion arranged to be inserted into the cover box portion, a base having a rectangular frame shape, an external connector arranged to be connected to a connector of the PC card slot, a circuit board on which an internal connector arranged to be connected to an internal connector disposed in the cover box is mounted and a bottom cover having an extension portion arranged to be inserted into the cover box portion, and the cover box portion has an insertion opening into which a rear end of the card portion is inserted.

The PC card of the present invention and having the above-mentioned structure, in which the card portion and the cover box portion are formed individually from each other and separably connected to each other, the members for forming the card portion can be manufactured without any considerable influence of change in the design of elements for forming the cover box. Therefore, even if the design of the cover portion of the cover box portion is changed, the elements for forming the card portion can be manufactured by the previous molds.

As a result, even if the design of the cover portion is changed, only the minimum number of molds is required to be again manufactured. Thus, the initial cost can be reduced and the design freedom of the cover box portion can be improved. Since the card portion and the cover box portion can individually be manufactured, assembly can easily be performed.

DETAILED DESCRIPTION OF THE PREFERRED EMBODIMENT

An embodiment of the present invention will now be described with reference to the drawings.

Figure 1:
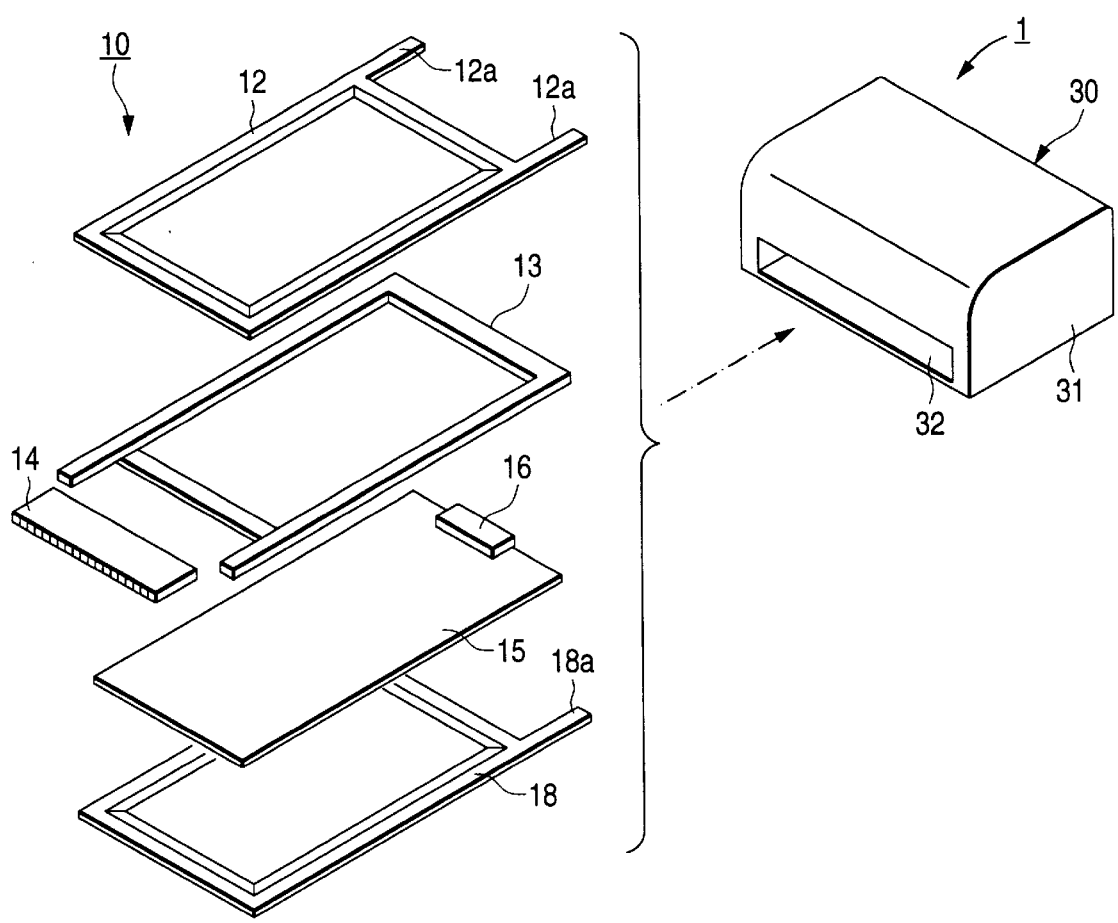
FIG. 1 is an exploded perspective view showing a PC card of the present invention.
Figure 2:
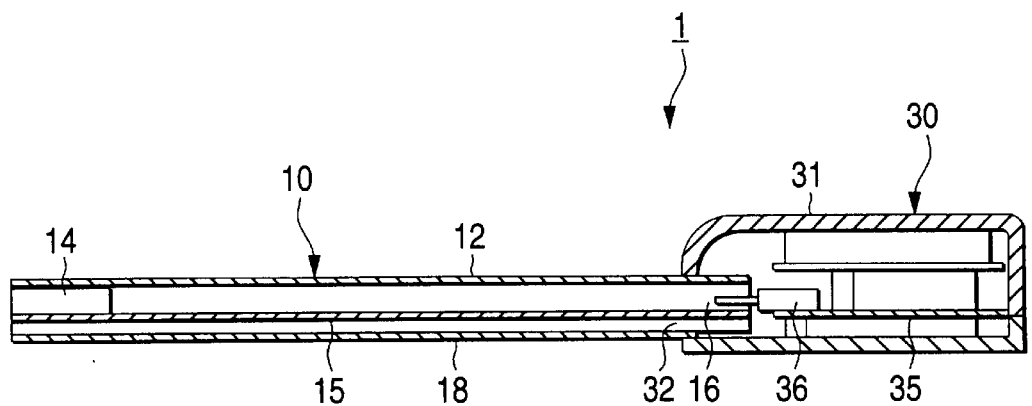
FIG. 2 is a cross sectional view showing the PC card shown in FIG. 1.

FIG. 1 is an exploded perspective view showing a PC card of the present invention, and FIG. 2 is a cross sectional view.

Figure 3:
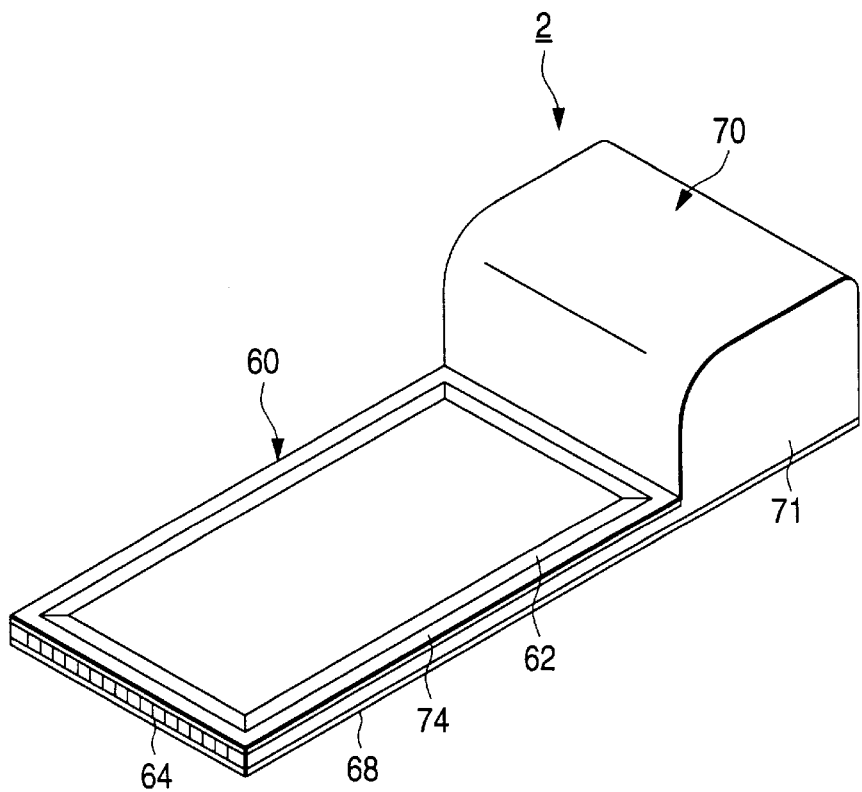
FIG. 3 is a perspective view showing a conventional PC card.
Figure 4:
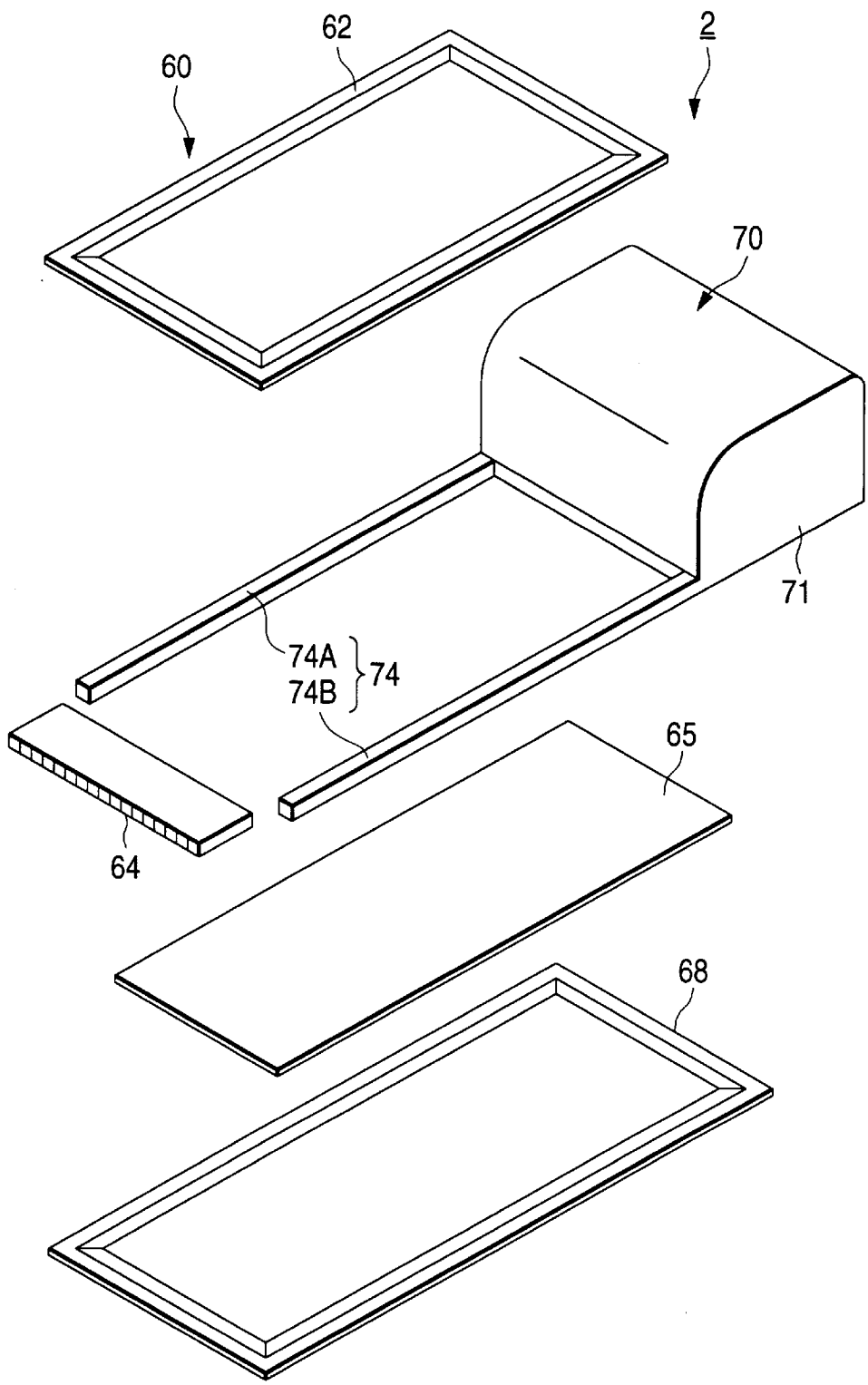
FIG. 4 is an exploded perspective view showing the conventional PC card shown in FIG. 3.

The illustrated PC card 1 is, similar to the conventional PC card 2 shown in FIGS. 3 and 4, a PCMCIA expansion card arranged to be inserted into a PC card slot formed in a portable personal computer as, for example, a radio having an FM teletext broadcast receiving function. The PC card 1 is composed of a plate-like card portion 10 arranged to be inserted into the PC card slot and a cover box portion 30 having a thickness larger than that of the card portion 10. The card portion 10 and the cover box portion 30 are formed individually from each other and separably connected to each other.

That is, the card portion 10 has a top cover 12 having extension portions 12a arranged to be inserted into the cover box portion 30 and made of stainless steel (SUS), a base 13 having a rectangular frame shape, an external connector 14 arranged to be connected to a connector of the PC card slot, a circuit board 15 having a leading end, on which the external connector 14 is mounted, a rear portion, on which an internal connector 16 arranged to be connected to an included connector 36 (see FIG. 2) disposed in the cover box portion 30 is mounted and other required electronic elements (not shown) are mounted and a stainless-steel (SUS) bottom cover 18 having extension portions 18a formed similarly to the extension portions 12a of the top cover 12 and arranged to be inserted into the cover box portion 30.

On the other hand, the cover box portion 30 has an insertion opening 32 into which the rear end of the card portion 10 is inserted. Moreover, a circuit board 35 on which the included connector 36, to which the internal connector 16 is connected, and electronic elements and the like (not shown) having a broadcast receiving function are mounted is accommodated in the cover box portion 30. On the outer surface of the cover box portion 30, for example, a volume adjustment knob, an antenna terminal and a headphone terminal (each of which is not shown) are disposed.

The card portion 10 of the PC card 1 having the above-mentioned structure is assembled in such a manner that the top cover 12, the circuit board 15 and the bottom cover 18 are stacked on the upper and lower surfaces of the base 13. Then, the rear end of the assembled card portion 10 is inserted into the insertion opening 32 formed in the cover box portion 30 to connect the internal connector 16 of the card portion 10 to the included connector 36 of the cover box portion 30 so that the two elements are integrated.

The PC card 1 according to this embodiment has the above-mentioned structure in which the card portion 10 and the cover box portion 30 are formed individually from each other and separably connected to each other. Therefore, the top cover 12, the base 13, the circuit board 15, the bottom cover 18 and the external connector 14 forming the card portion 10 can be manufactured without any considerable influence of change in the design of an element forming the cover box.

Therefore, even if the design of the cover portion 31 of the cover box portion 30 is changed, the elements for forming the card portion 10 can be manufactured by the previous molds.

As a result, even if the design of the cover portion 31 is changed, only the minimum number of molds is required to be again manufactured. Thus, the initial cost can be reduced and the design freedom of the cover box portion 30 can be improved. Since the card portion 10 and the cover box portion 30 can individually be manufactured, assembly can easily be performed.

What is claimed is:

1. A PC card comprising:

a plate-like card portion having rearwardly extending extensions and a rear end, said plate-like card portion arranged to be inserted into a PC-card slot; and a cover box portion having a thickness larger than that of said card portion and having an opening on a surface which opposes to said card portion, wherein said rearwardly extending extensions and rear end are inserted into said opening of said cover box, and wherein said card portion and said cover box portion are formed individually from each other and separably connected to each other.

2. A PC card according to claim 1, wherein said card portion includes a first circuit board on which an internal connector is mounted, and said cover box portion accommodates a second circuit board on which an included connector is mounted, and wherein said first circuit board and said second circuit board are separably connected to each other by connecting said internal connector with said included connector.

3. A PC card according to claim 1, wherein said card portion includes a top over and a bottom cover having a pair of extension portions arranged to be inserted into said cover box portion, respectively.

4. A PC card according to claim 2, wherein said internal connector is inserted into said opening of the cover box and connects with said included connector within said opening.

5. A PC card according to claim 1, plate-like card portion includes a base, said base having forward extending projections.

6. A PC card according to claim 5, wherein an external connector is placed between said forward extending projections of said base.

7. A PC card according to claim 6, further comprising a circuit board having an internal connector, said internal connector opposing said external connector and being inserted within the opening of said cover box portion.

* * * * *